United States Patent [19]

Stern et al.

[11] 4,290,118

[45] Sep. 15, 1981

[54] SOLID STATE DEVICES COMBINING THE USE OF SURFACE-ACOUSTIC-WAVE DEVICES AND CHARGE-COUPLED DEVICES

[75] Inventors: Ernest R. Stern, Concord; Richard W. Ralston, Bedford; Daniel L. Smythe, Jr., Carlisle; Barry E. Burke, Lexington, all of Mass.

[73] Assignee: Massachusetts Institute of Technology, Cambridge, Mass.

[21] Appl. No.: 80,100

[22] Filed: Sep. 28, 1979

[51] Int. Cl.³ ............................................. G11C 11/40
[52] U.S. Cl. .................................... 365/183; 357/24; 365/157
[58] Field of Search .................. 365/157, 183; 357/24

[56] References Cited
U.S. PATENT DOCUMENTS

| | | | |
|---|---|---|---|
| 4,070,652 | 1/1978 | Heng et al. | 365/157 |
| 4,101,965 | 7/1978 | Ingebrigtsen | 365/157 |

*Primary Examiner*—Terrell W. Fears
*Attorney, Agent, or Firm*—Arthur A. Smith, Jr.; Robert F. O'Connell

[57] ABSTRACT

A solid state device combining the use of a surface-acoustic-wave (SAW) device and a charge-coupled device (CCD) which utilizes an interface means therebetween comprising a plurality of conductive fingers responsive to an acoustic wave on the SAW device. The conductive fingers are electrically connected at at least one end to the CCD substrate and a plurality of temporary storage means are used for temporarily storing a charge proportional to the voltage potential on the associated conductive finger. The temporary stored charges can be transferred to the storage wells of the CCD for storing a replica of the acoustic wave. The SAW-CCD combination is adapted for use as a buffer memory, an accumulating correlator, or as a matched filter device.

19 Claims, 7 Drawing Figures

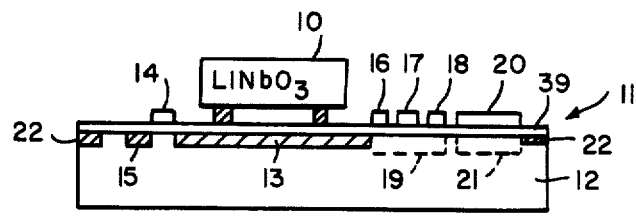
FIG.1 PRIOR ART
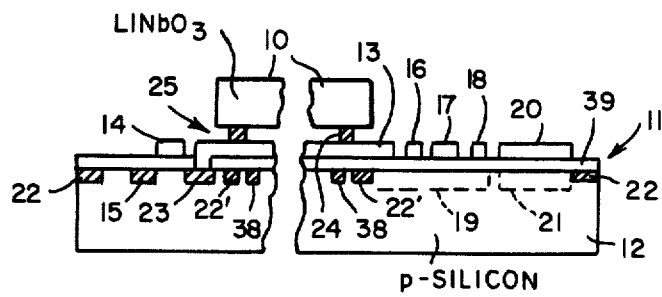
FIG.2
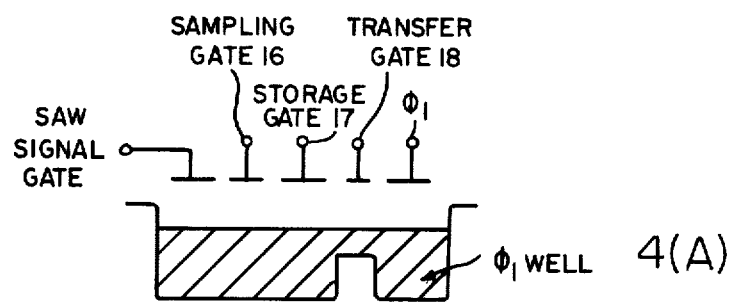
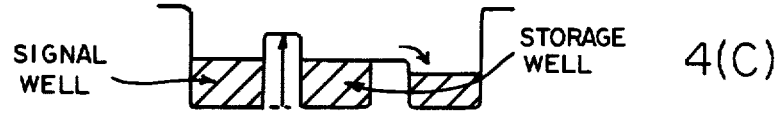
FIG.4
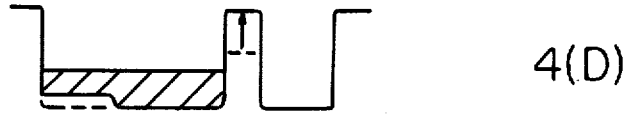
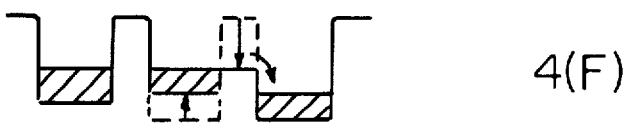

SOLID STATE DEVICES COMBINING THE USE OF SURFACE-ACOUSTIC-WAVE DEVICES AND CHARGE-COUPLED DEVICES

The Government has rights in this invention pursuant to Contract Number AF19(628)-78-C-0002 awarded by the U.S. Department of the Air Force.

INTRODUCTION

This invention relates to solid state devices comprising a combination of surface-acoustic-wave devices and charge-coupled devices, which solid state device provides operation as a buffer memory, an accumulating correlator, or a matched filter, and the like.

BACKGROUND OF THE INVENTION

It has been suggested that the advantages of surface-acoustic-wave (SAW) devices and the advantages of charge-coupled devices (CCD) can be utilized in an overall device using a combination of both, which overall device can be arranged to compensate for some of the individual limitations in certain applications of each of these two classes of devices.

A first suggestion for the use of such devices was set forth in the article "Charge-Coupled Devices: SAW/CCD Buffer Memory", Solid State Research Report, published by Lincoln Laboratories of the Massachusetts Institute of Technology, No. ESD-TR-77-294, pp. 37–39, 1977. In the article an integrated buffer memory was proposed utilizing a SAW input section and a CCD output section appropriately arranged to interact so as to provide a fast-in, slow-out buffer memory operation.

In such structure a substrate of p-type silicon is mounted adjacent a SAW piezoelectric substrate and has imbedded therein a plurality of $n^+$-type silicon sampling fingers. Such fingers are separated by boron channel stops within the silicon substrate. The sampling fingers are appropriately precharged to a desired potential and a wide-band signal is entered at an input transducer of the SAW device so as to generate a propagating surface acoustic wave having a piezoelectric displacement field above the surface of the SAW substrate. Such field modulates the potential on each of the sampling fingers and, thus, modulates the charges in the storage wells of the CCD electrodes which are coupled thereto.

Such a system using combined SAW/CCD devices as described therein, however, tends to give rise to undesirable distributed leakage problems which distort the charges in the wells of the CCD device and produce inaccurate buffer storage characteristics. Nor does the article disclose any uses for the overall device other than as a buffer storage element.

BRIEF SUMMARY OF THE INVENTION

In accordance with the invention a combination of a surface acoustic wave device and a charge-coupled device is arranged to have a configuration wherein the sampling fingers are formed of a conductive material which is insulated from the silicon substrate and placed on the surface thereof with a suitable insulator therebetween. Such device substantially reduces the possibility for distributed leakage and tends to overcome the problems of the previously proposed SAW/CCD combination.

Moreover, the use of a more effective technique for charging the CCD device via a suitable "fill and skim" charge transfer technique in the wells thereof further enhances the operation of the device as a buffer memory. Moreover, such device becomes readily adaptable for use as an accumulating correlator device. Further, additional modifications thereto permit such configuration also to be readily adaptable for use as a programmable matched filter device.

DESCRIPTION OF THE INVENTION

The invention can be described more completely with the help of the accompanying drawings wherein FIG. 1 shows an effective diagrammatic end-view of a SAW/CCD device in accordance with the prior art;

FIG. 2 shows an effective diagrammatic end-view of a device in accordance with the invention;

Figure 3:
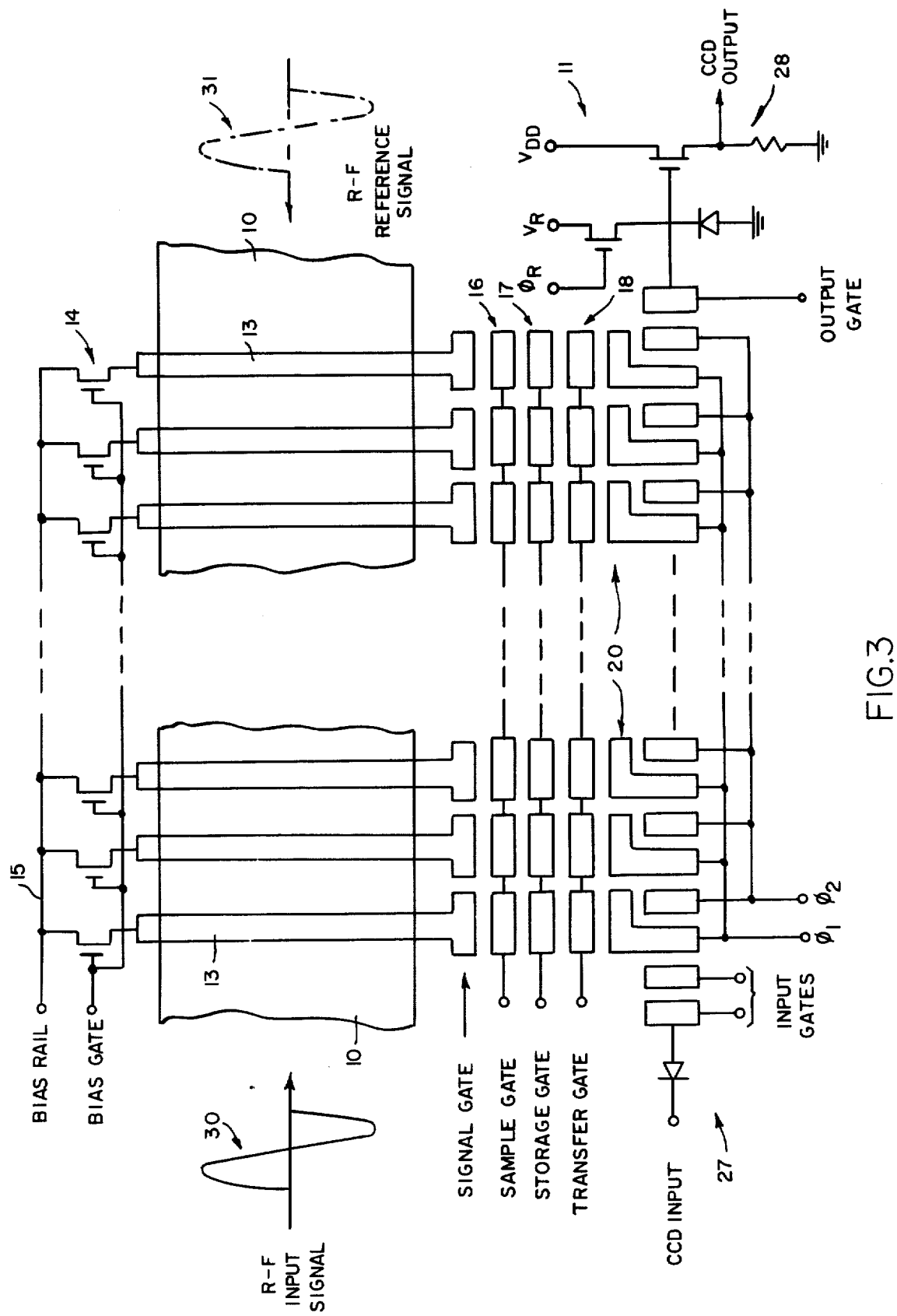
FIG. 3 shows a diagrammatic plan view of the device of FIG. 2.
Figure 5:
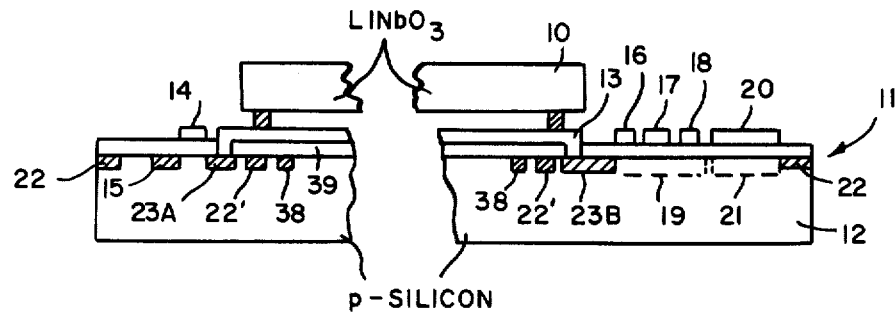
Figure 6:
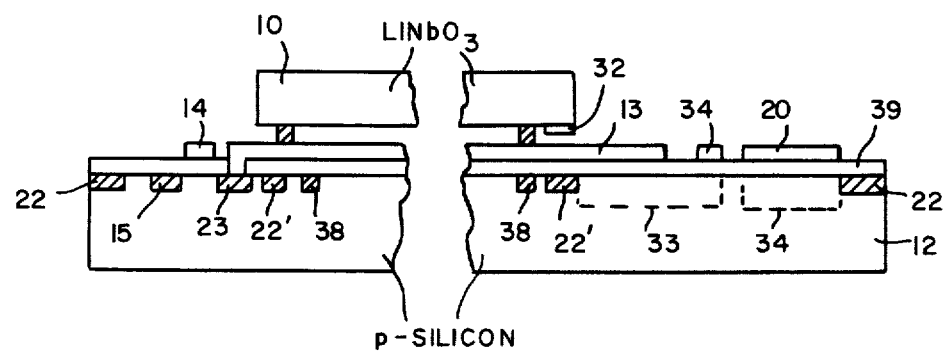
Figure 7:
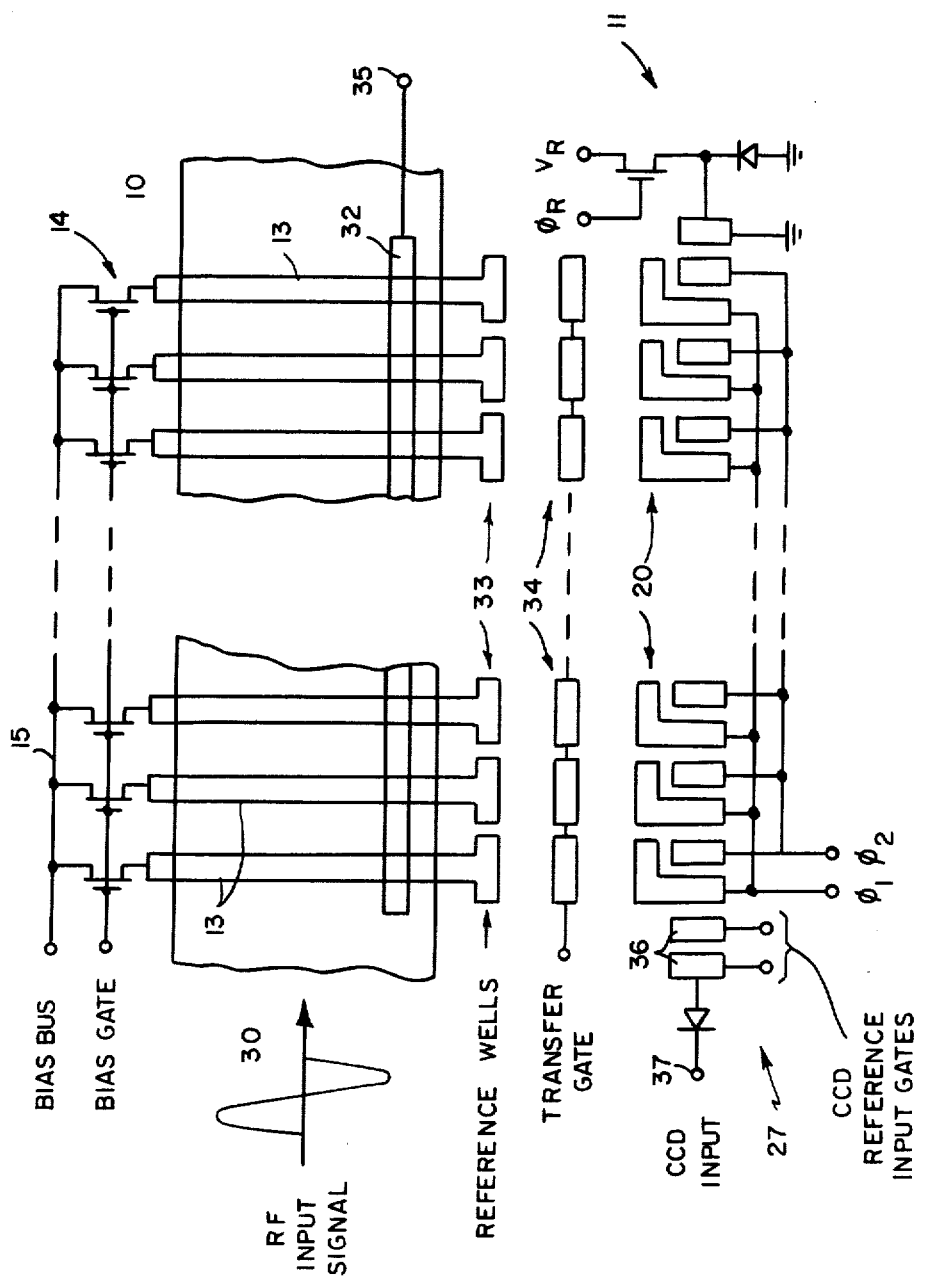

FIGS. 4(A) through 4(F) show in sequence a technique for charging the wells of the CCD device depicted in FIGS. 2 and 3;

FIG. 5 shows an effective diagrammatic end-view of a modification of the device of FIG. 2; and FIGS. 6 and 7 show a modification of the device of FIGS. 2 and 3 for use as a programmable matched filter.

In the device of FIG. 1, which is substantially the same as that discussed in the above mentioned article, a SAW piezoelectric delay line 10, using a lithium niobate substrate, is integrated with a charge-coupled shift register device 11 using a silicon substrate 12 to provide for a fast-in, slow-out buffer memory.

In FIG. 1, for example, the lithium niobate ($LiNbO_3$) delay line 10 is mounted in close proximity to an array of sampling fingers 13. For example, in a typical device the array may comprise 300 sampling fingers of the CCD device. Each of the fingers 13 is embedded in the upper surface of a p-type silicon substrate 12 and extends beneath the lower surface of the SAW delay line 10.

As described in the aforesaid article, the device includes a plurality of biasing transistors 14 and a biasing rail, or bus, 15 for permitting the precharging of fingers 13 prior to the application of an input signal. The device further includes a plurality of sampling gates 16, storage gates 17 and transfer gates 18 associated with the input storage wells 19 of the CCD device. A plurality of CCD electrodes 20 and storage wells 21 associated therewith permit the storage of charge therein to provide for a stored replica of an input signal as discussed therein. A plurality of channel stops 22 are also formed in silicon substrate 12 to prevent migration of charge along the surface of substrate 12 beyond the operating regions of the overall device.

While the device shown in FIG. 1 and more completely discussed in the aforesaid article operates to provide for storage of an input signal applied to the SAW device, problems as to the accuracy of the stored charges in replicating the input signal arise because of distributed leakage of such charges which tends to occur in the structure.

An improved SAW/CCD device is depicted in FIGS. 2 and 3, wherein corresponding elements are designated by the use of the same reference numerals as used in FIG. 1. As can be seen, the sampling fingers 13 are arranged so as to lie on the surface of an insulating layer 39 on the upper surface of CCD silicon substrate 12. The fingers are made of conductive material, such as aluminum, and are attached at one end to the surface of silicon substrate 12 at a region 23 of the substrate which contains n+ silicon diffused therein. The n+ bias rail 15 is electrically connected to each of the sampling fingers 13 via a plurality of bias transistors 14. The SAW lithium niobate substrate 10 may be separated from the upper surface of sampling fingers 11 by suitable spacers 24, the surfaces, in general, thereby being separated by an appropriate air gap 25.

A plurality of sampling gates 16, a plurality of storage gates 17 and a plurality of transfer gates 18, each group thereof being associated with each of the sampling fingers 13 and CCD electrodes 20 are mounted on the surface of silicon substrate 12 in the manner described in FIGS. 2 and 3. The extensions of fingers 13 in effect form a plurality of signal gates as shown in FIG. 3. The configuration of the $\phi_1$ electrodes 20, the $\phi_2$ electrodes, the input gates and circuitry 27 and the output gates and circuitry 28 of the CCD portion of the overall device is known to the art, as shown in FIG. 3. Pairs of inner channel stops 22' are positioned adjacent regions 23 and the regions below the finger extensions which form the signal gates as shown in FIG. 2. Further pairs of inner n+ regions 38 are positioned adjacent channel stops 22' for purposes discussed in more detail below.

Prior to the application of an RF input signal 30 (FIG. 3) to the lithium niobate substrate 10, which application provides a traveling surface acoustic wave, the sampling fingers 13 are precharged to the potential of the bias bus, or rail, 15 via a linear array of enhancement-mode, metal-oxide-semiconductor (MOS) bias transistors 14. When the bias transistors 14 are opened, the sampling fingers 13 are allowed to float electrically and a wide-band data signal can be applied to an appropriate input transducer (not shown) of the SAW delay line 10, in accordance with well-known SAW techniques.

In such sequence of the operation, transfer gates 18 are closed so that the CCD device, which in effect acts as a parallel-loaded shift register, is isolated from the sampling fingers 13 and the associated charged storage wells 19.

The RF field associated with the RF input signal, which field travels with the acoustic wave along the surface of piezoelectric substrate 10, modulates the potential on each of the sampling fingers 13 and the charge storage wells associated therewith, i.e., the signal, sample, storage and transfer wells under each of the gates shown in FIG. 3. Charge is exchanged between the signal wells and the storage wells through the intermediate sampling wells by control of the associated sample gate 16, while charge is transferred from the storage wells to the $\phi_1$ wells by control of the transfer gates 18.

At the time when it is desired to store the RF signal present on the surface of SAW device 10 into the CCD device, the sampling gates 16 are closed by applying an appropriate voltage step having a transition time which is relatively short compared with one-half the RF period. A sampled replica of the surface acoustic waveform is stored in the plurality of storage wells associated with storage gates 17. The transfer gate is then opened to parallel load the packets of charge in the storage wells into the CCD $\phi_1$ wells, as in a shift register, whereupon the signal, which had been a relatively high-frequency SAW signal, becomes available for serially shifting out of the CCD storage register at the output circuit thereof at a much lower rate in accordance with well-known CCD techniques.

Because the sampling fingers 13 in the devices shown in FIGS. 2 and 3 are isolated from the silicon substrate 12, being isolated by the non-conductive layer 39 and are in turn isolated from the lithium niobate substrate 10 by the air gap 25 and the n+ region 23, the distributed leakage of charge is minimized and the stored reproduction of the input RF waveform at the SAW device is more accurate than that achieved when using the embedded sampling fingers of the prior art device of FIG. 1.

A potential disadvantage of the devices of FIGS. 1, 2 and 3 is that the dynamic range thereof is limited by the fixed-pattern noise which is generally inherent in CCD devices having parallel inputs such as shown herein. A large portion of such noise results from threshold voltage variations among the gates involved, which variations are caused by small inhomogeneities in the silicon substrate crystal. In order to reduce such fixed-pattern noise a technique for providing charge equilibration clocking has been devised which reduces significantly the effect of such inhomogeneities. Such technique is, in effect, a modification, or extension, of a technique which has previously been described in an article of S. P. Emmons et al. in International Electron Devices Meeting Technical Digest, IEEE, New York, 1974, at pages 233-235.

The improved "fill and skim" technique of the invention can be best understood with the help of the sequence of drawings shown as FIGS. 4(A) through 4(F). The terminals indicated at the top of the drawings are associated with the finger extensions which effectively form a signal gate, a sampling gate 16, a storage gate 17, a transfer gate 18 and a CCD $\phi_1$ gate, respectively, the wells associated therewith being formed when appropriate gate voltages are applied thereto. The overall technique can be described as follows.

All of the wells under the gates, together with the $\phi_1$ well, are first filled from the CCD $\phi_1$ well 21 with the transfer gate being partially closed as shown in FIG. 4(A). The $\phi_1$ well 21 is then emptied and the excess charge from the other wells is skimmed over the partially closed transfer gate into the $\phi_1$ well, as shown in FIG. 4(B). The sampling gate is then closed momentarily in order to make the total charge as shown in FIG. 4(C) independent of the threshold voltage of gate 16.

When the momentarily closed sampling gate is opened, the transfer gate is closed and the RF field associated with the surface acoustic wave causes charge to be exchanged between the signal well and the storage well, as shown in FIG. 4(D). The sampling gate is then fully closed to capture the charge resulting from the RF input signal in the storage well, as shown in FIG. 4(E), wherein both the sampling gate and the transfer gate are shown as closed for such purpose. The charge stored in the storage well is then transferred to the CCD $\phi_1$ well by partially opening the transfer gate and skimming off a portion of the signal charge by raising the storage well as shown in FIG. 4(F).

If some charge is left behind in the storage well, then the output charge is expected to be independent of all threshold voltages but will still depend upon residual effects not otherwise considered.

The fact that the transfer gate is partially opened in the same way at the end in FIG. 4(F) as at the beginning in FIG. 4(B) assures that, if no signal charge is present in the storage well, then the charge in the CCD $\phi_1$ well will be equal to the bias charge only. If, however, there is a signal charge in the signal well, what spills out into the CCD $\phi_1$ well is primarily the signal charge plus the bias charge, with a minimized amount of residual noise.

It is not necessary to recover the full spatial content of the traveling acoustic wave at the piezoelectric substrate if the bandwidth $\Delta f$ of such signal is limited. The required spacing of the sampling fingers can be determined by defining an effective sampling frequency $f_s$ which is related to the spatial period of the sampling fingers S through the velocity of the surface acoustic wave $V_a$ by the following formula:

$$f_s = V_a/S$$

The spatial period S also represents the cell size of the CCD electrodes since there must be one CCD cell or electrode for each sampling finger. As discussed with regard to the particular configuration in the above-referenced Lincoln Laboratory article, since the input signal is contained in a limited band, the piezoelectric wave can be undersampled at a frequency below the spectrum of the input signal and the effective output carrier frequency is translated downward from its RF carrier signal $f_c$ by an amount equal to the sampling frequency $f_s$.

The frequencies $f_s$ and $f_c$ must be chosen carefully so that the output data stream is an accurate replica of the input signal and does not contain any undesirable signal distortion.

In a particular embodiment of the invention which has been effectively constructed and operated, a convenient CCD cell size of 40.6 micrometers has been selected, which selection defines $f_s$ to be 85.6 MHz., if a lithium niobate delay line with a propagation velocity of 3480 meters per second is used. Such a sampling frequency constrains the input frequency to be within the range of from 85.7 MHz to 128.6 MHz for a maximum bandwidth of 43 MHz around an RF center frequency of 107.2 MHz. A 300-stage device utilizing such cell size and 300 sampling fingers is 12.2 mm. long and has an acoustic time delay of 3.5 microseconds.

A specific device built in accordance with the above description has been tested at a CCD clock rate of 100 kHz and at input signal frequencies between 80 and 130 MHz. The frequency of such device falls off inside the pass band of the input transducer in a manner which is predicted by theory. In a system application, for example, such fall off can be eliminated by tailoring the response of the input transducer and its matching network in order to flatten out the overall response. The signal which has been parallel loaded into the CCD can be appropriately shifted out in serial fashion, as is well known with CCD devices, at a rate determined by the CCD clock which, as mentioned above, in a particular exemplary configuration can be set at 100 kHz. Such a device then represents a very compact solid state device which serves to rapidly store (fast-in) relatively wide-band analog signals and to read them out at a relatively slow data rate (slow-out). Devices of this type, for example, should be able to provide wide-band analog buffer memory functions for as many as 1000 discrete samples.

An alternative configuration for the sampling fingers is shown in FIG. 5 wherein the sampling finger 13 which couples to the surface acoustic wave of lithium niobate substrate 10 is attached to silicon substrate 12 at both ends through regions 23A and 23B, respectively, which are regions of n+ material. In such configuration the coupling of the surface-acoustic-wave device to the CCD device is, in effect, changed from an effective signal-gate coupling, as in FIGS. 2 and 3, to a diode coupling, the regions 23B at the surface of the silicon substrate, in effect, acting as diodes. Such configuration avoids the voltage drop which occurs across the insulator 39 in the signal gate configuration described above in FIGS. 2 and 3 and produces a substantially unity transfer characteristic of the SAW signal, with considerably reduced signal coupling loss.

The above configurations are discussed in connection with the use of the SAW/CCD combination device as a fast-in, slow-out memory buffer. Such a configuration can also be readily adapted for use in reading out the cross-correlation function of two wide-band SAW input signals which counter-propagate on the SAW delay line.

With reference to FIGS. 2 and 3 (or the modified embodiment of FIG. 5) in such device two counter-propagating surface waves, for example, are obtained by applying an RF input signal 30 and an RF reference signal 31 (shown in dot-dash line in FIG. 3) from transducers (not shown) located at opposite ends of the SAW delay line 10, the signals being appropriately applied to the lithium niobate substrate from such transducers in accordance with well-known techniques. Both input traveling waveforms are picked up by the sampling fingers 13 and are mixed, or multiplied, together by the non-linear characteristics of the silicon material, in the space-charge layer underlying the fingers, or the diodes 23 (or 23A and 23B as used in FIG. 5) or both.

The mixed products from such non-linear interaction of the signal and reference waves are accumulated across a highly resistive region defined by one or more of the nearly closed gates 16, 17 or 18 for storage in the wells under the CCD $\phi_1$ gates of FIGS. 2 and 3 (or FIG. 5) by stopping the CCD clocks with the $\phi_1$ gate signal on during the accumulation interval. Prior to launching the counter-propagating signals, the wells under the signal, sample, and storage gates of FIGS. 2 and 3 (or the sample and storage gates of FIG. 5) are partially filled with charge in the same manner as discussed above with reference to storing a single RF input signal. Thus, the multiplication and accumulation processes produce a spatial variation of the initially uniform charge distribution in the CCD device, with the charge in each CCD $\phi_1$ well now representing a discrete sample of the products, i.e., the correlation, of the input signal waveform with the reference signal waveform. When the charge is clocked out of the CCD at a convenient date rate such spatial variation becomes a time-sampled data representation of the desired correlation function.

FIGS. 6 and 7 show a configuration in accordance with the invention for use as a matched filter device. As can be seen herein, and as described in connection with the previous embodiments, a lithium niobate substrate 10 has an RF input signal 30 applied thereto to produce a traveling surface acoustic wave on a surface thereof for interaction with a plurality of DC bias potentials associated with sampling fingers 13, which bias potentials were previously set by a CCD-loaded reference pattern. Non-linearities in the silicon effectively multiply the RF and DC potentials, and the local product terms are capacitively coupled to and summed by the output electrode 32, thereby producing the desired cross-correlation output at the output terminal 35.

Prior to transfer of the surface acoustic wave charges into the $\phi_1$ wells of the CCD device, a reference signal is applied to the CCD device via input circuit 27 to provide in effect a DC bias on each of the sampling fingers as determined by the pattern of the reference signal which is so loaded into the $\phi_1$ wells of the CCD device. When the RF input signal 30 is applied, non-linearities in the silicon substrate 12 of the CCD device effectively multiply the RF signal and the DC bias potentials involved so that the sampled product terms thereof, which are thereby present at each sampling finger, can be capacitively coupled to a conductive summing electrode 32 positioned at the surface of substrate 10 to provide a summation of all of the sampled product terms at matched filter output terminal 35.

Summing electrode 32 can be formed of aluminum, for example, which is deposited on substrate 10 along a line which is effectively outside the path of travel of the surface acoustic wave on the substrate surface in order not to distort the SAW phase fronts. Such electrode is positioned in the gap between substrate 10 and the sampling fingers 13 and is, thus, gap-coupled to the fingers, as shown in FIG. 6.

The device of FIGS. 6 and 7 bears structural similarities to that of FIGS. 2 and 3. However, the operation thereof differs in that the acoustic-electric interaction discussed in FIGS. 6 and 7 is a non-linear one and the device thereof is in effect a slow-in, fast-out device in contrast with the fast-in, slow-out buffer device of the earlier discussed embodiment.

In accordance with a more detailed description of the operation of the matched filter device of FIGS. 6 and 7, prior to the application of RF input signal 30, the sampling fingers 13 are precharged to an appropriate potential by means of the linear array of enhancement-mode MOS transistors 14. After the biasing transistors 14 are turned off, allowing the sampling fingers 13 to float electrically, the CCD reference voltage waveform is applied across the CCD reference input gates 36 while the CCD input diode terminal 37 is pulsed at the CCD clock rate to allow analog samples of the reference charge to fill the CCD $\phi_1$ wells. Serial clocking of the CCD shift register device is halted once all of the $\phi_1$ wells of the CCD contain the desired spatial charge pattern. Charges from each of the $\phi_1$ wells are then transferred through transfer gates 34 to the reference wells 33 associated with each corresponding sampling finger 13, resulting in a spatial variation of the initially uniform potential previously provided thereat by the precharging process on the array of sampling fingers.

In effect, the spatial variation of such potentials obtained by this process biases the sampling fingers 13 so that they can act as a plurality of independent varactors which can be used to perform the required multiplication between the reference charges and the RF fields that accompany a surface acoustic wave signal as it propagates along substrate 10, the RF fields effectively propagating through the interaction region. The silicon nonlinearities are characteristic of both the drain regions 23 of the bias transistors as well as the MOS regions underlying the sampling fingers. Optimization of the nonlinear acousto-electric interaction can be obtained by adjusting the uniform sampling finger bias potentials, as described earlier above, to control the space-charge layer underlying the sampling array.

The cross-correlation between the SAW RF input signal and the CCD reference signal is obtained by summing the resultant local product terms by means of the output electrode 32. For the special case in which the SAW signal is an impulse signal, the output at terminal 35 will represent a time-compressed, serial scan of the reference pattern, in effect producing a slow-in fast-out buffer memory, the device having buffered the reference input signal.

In a specific embodiment of the matched filter discussed above, a CCD $\phi_1$ cell size of 40.6 micrometers defines an effective sampling frequency of 85.7 MHz for the RF input signal to produce the desired acousto-electric interaction. The signal band width which can be match-filtered without sampling ambiguities lies in the range from 85.7 MHz to 128.6 MHz. Using 300 sampling fingers, for example, and a 100 kHz clock rate for the CCD device, an audio reference signal with a frequency range of 0 kHz to 50 kHz can be used. A specific embodiment of a successful device made in accordance with the invention has operated with the following parameters as set forth in Table I below:

TABLE I

| | |
|---|---|
| Signal input center frequency | 107 MHz |
| Signal input bandwidth | 40 MHz |
| CCD clock rate | 100 kHz |
| Reference input center frequency | 25 kHz |
| Reference input bandwidth | 50 kHz |
| Signal input duration | 3.5 $\mu$s |
| Reference holding time | 1.0 s |
| Maximum input power | 27 dBm |
| Maximum output power | −41 dBm |
| Dynamic range over kTB | 57 dB |
| Peak-to-spurious ratio | 14 dB |
| Time-bandwidth product | 150 |

Such a device makes possible real-time processing of wide-band inputs combined with low-speed, CCD-programmable reference patterns. Such device is compatible with high-density, low-cost integrated circuits for storing a set of reference waveforms which can be used therewith.

In the device of FIGS. 6 and 7, as well as in the devices of FIGS. 2, 3 and 5, the presence of electrons in the silicon substrate 12 beneath sampling fingers 13 can adversely affect the operation of the piezoelectric delay line. In order to prevent such adverse action, the auxiliary n+ junctions 38 shown therein are formed at the surface of substrate 12 adjacent the inner isolation, or channel stop, junctions 22' under fingers 13. The n+ junctions 38 act to drain off electrons which are present beneath the fingers and to reduce such adverse effects. The junctions 38 are placed outside the path of the surface acoustic wave and have a small potential applied thereto (e.g., any voltage above about 2 volts, or so).

Further, while the summing electrode 32 in FIGS. 6 and 7 is shown positioned on the surface of substrate 10, alternatively the summing electrode can be placed on insulative regions positioned on the upper surfaces of conductive fingers 13 beyond the exterior limits of the lithium niobate at either end of the fingers. Such a structure may tend to make the fabrication thereof easier.

Further, while the embodiments discussed above utilize an effective one-dimensional CCD storage register, it is possible to extend the concept thereof to the use of an effective two dimensional array which includes additional parallel-connected CCD storage registers, successive sampled charges representing successive samples of an input signal being stored in successive registers as each sampled charge is transferred by suitable charge transfer means to the next adjacent successive register of the parallel array thereof.

Moreover, while the surface acoustic wave devices in the specific embodiments described herein are formed on separate substrates, it is possible to form the SAW device as part of an overall monolithic device which uses a single substrate for both the SAW device and the CCD device. Accordingly, any suitable means for producing a surface acoustic wave with its associated electric fields and any suitable means for coupling such signal to the CCD device can be used within the spirit and scope of the invention.

Other modifications to the embodiment of the invention discussed above any occur to those in the art within the spirit and scope of the invention. Accordingly, the invention is not to be construed as limited to the specific embodiments so disclosed, except as defined by the appended claims.

What is claimed is:

1. A solid state device comprising
a surface acoustic wave device including
a first substrate capable of supporting a travelling acoustic wave signal on a surface thereof;
means for generating a first travelling acoustic wave input signal on said surface, said acoustic wave signal having an electromagnetic field associated therewith;
a charge-coupled device including
a second substrate having an insulating layer positioned on a surface thereof adjacent said first substrate so as to form a spatial region therebetween;
a plurality of charge storage wells, each capable of holding a charge therein;
interface means comprising
a plurality of conductive means positioned on said insulating layer each of said conductive means electrically connected at at least one end to said second substrate and associated with one of said charge storage wells of said charge-coupled device, each of said conductive means being responsive to a portion of the electromagnetic field of said acoustic wave signal to produce on said conductive means a voltage potential proportional to the corresponding portion of the electromagnetic field;
a plurality of first storage means each capable of being formed in said second substrate and associated with each of said conductive means for storing a charge therein;
said plurality of charge storage wells capable of being formed in said charge-coupled device and associated with each of said conductive means;
means for transferring charges between said first storage means and their associated charge storage wells.

2. A solid state device in accordance with claim 1 wherein
said storage means are each capable of storing charges therein which are proportional to the voltage potentials on their associated conductive means; and
each of said transferring means is capable of transferring said stored charges to their associated charge storage wells so that the charges in said charge storage wells form a representation of said travelling acoustic wave signal.

3. A solid state device in accordance with claims 1 or 2 wherein said plurality of conductive means comprise a plurality of conductive fingers each having one end electrically connected to the surface region of said second substrate and the other end coupled to said second substrate through said insulating region, said other end operating as a signal gate means for permitting a charge to be stored in said first storage means.

4. A solid state device in accordance with claims 1 or 2 wherein said plurality of conductive means comprise a plurality of conductive fingers each having one end electrically connected to a first surface region of said second substrate and the other end electrically connected to a second surface region of said substrate, said second surface retion operating as a diode storage means for permitting a charge to be stored therein.

5. A solid state device in accordance with claim 3 wherein said transferring means includes
an intermediate storage means for storing a charge therein;
sample gate means between said first and said intermediate storage means for transfer of charge from said first storage means to said intermediate temporary storage means; and
transfer gate means between said intermediate storage means and said charge storage wells for permitting the transfer of charge from said intermediate storage means to said charge storage wells.

6. A solid state device in accordance with claim 4 wherein said transferring means includes
an intermediate storage means for storing a charge therein;
sample gate means between said diode storage means and said intermediate storage means for transfer of charge from said diode storage means to said intermediate storage means; and
transfer gate means between said intermediate storage means and said charge storage wells for permitting the transfer of charge from said intermediate storage means to said charge storage wells.

7. A solid state device in accordance with claims 5 or 6 and further including channel stop means positioned in the surface of said second substrate so as to prevent the migration of charges beyond the operating regions of said device.

8. A solid state device in accordance with claim 7 wherein said channel stop means include a pair of inner channel stop means positioned in the surface of said second substrate below and near the ends of said conductive fingers.

9. A solid state device in accordance with claim 8 and further including charge drain regions for removing unwanted charges which may tend to be present in the surface region of said second substrate below said conductive fingers.

10. A solid state device in accordance with claim 2 and further including means for providing an output signal from said charge-coupled device which is a substantial replica of a surface acoustic wave represented by the charges stored in the storage wells of said charge-coupled device.

11. A solid state device in accordance with claim 1 and further including
means for generating a second travelling acoustic wave input signal on said surface which travels in a direction opposite to that of said first acoustic wave input signal, said conductive means being responsive to said first and said second travelling acoustic wave signals to produce a mixing of said first and second travelling acoustic wave signals in said second substrate, the accumulated mixed products being stored in the storage wells of said charge-coupled device; and means for recovering said accumulated mixed products from said charge-coupled device to produce a time-sampled representation of the correlation function of said first and second travelling acoustic wave input signals.

12. A solid state device in accordance with claim 11 and further including charge drain regions at the surface of said second substrate for removing unwanted charges which may tend to be present in the surface region of said second substrate below said conductive means.

13. A solid state device in accordance with claim 1 and further wherein said charge-coupled device includes means for applying a reference signal to said charge-coupled device prior to the generation of said travelling wave signal to provide charges in the storage wells of said charge-coupled device which represent said reference signal so that the generation of said travelling acoustic wave signal thereby produces a multiplication of said reference signal and said travelling acoustic wave signal whereby a plurality of sample product terms are present at said conductive means; and summing means for summing said sample product terms to provide a matched filter output signal.

14. A solid state device in accordance with claim 13 wherein said summing means is a conductive electrode positioned on the surface of said first substrate in said spatial region and coupled to said conductive means.

15. A solid state device in accordance with claim 14 and further including charge drain regions at the surface of said second substrate for removing unwanted charges which may tend to be present in the surface region of said second substrate below said conductive means.

16. A solid state device in accordance with claim 13 wherein said summing means is a conductive electrode positioned on an insulative region positioned on said conductive means.

17. A solid state device comprising substrate means;

a charge-coupled device formed in said substrate means and having a plurality of charge storage wells each capable of being formed in said charge-coupled device and of holding a charge therein;

a plurality of storage means each associated with one of said charge-storage wells and capable of being formed in said substrate means for storing a charge therein;

means for providing one or more travelling surface acoustic wave signals representing one or more analog input signals;

a plurality of conductive means each associated with one of said charge storage wells of said charge-coupled device, said conductive means being responsive to the electromagnetic fields associated with said surface acoustic wave signal for coupling said electromagnetic fields to said storage means so that a charge dependent upon the amplitudes of said one or more signals is stored in each of said storage means; and means for transferring charges between each of said storage means and its associated charge storage well.

18. A solid state device in accordance with claim 17 wherein said conductive means are positioned on an insulating layer of said substrate means, each of said conductive means electrically connected at at least one end to said substrate means.

19. A solid state device in accordance with claims 17 or 18 and further wherein said charge-coupled device includes means for applying a reference signal to said charge-coupled device prior to providing said travelling wave signal to provide charges in the storage wells of said charge-coupled device which represent said reference signal so that the providing of said travelling acoustic wave signal thereby produces a multiplication of said reference signal and said travelling acoustic wave signal whereby a plurality of sample product terms are present at said conductive means; and summing means for summing said sample product terms to provide a matched filter output signal.

* * * * *